United States Patent [19]
Tran et al.

[11] Patent Number: 5,648,666
[45] Date of Patent: Jul. 15, 1997

[54] DOUBLE-EPITAXY HETEROJUNCTION BIPOLAR TRANSISTORS FOR HIGH SPEED PERFORMANCE

[75] Inventors: Liem Thanh Tran, Torrance; Dwight Christopher Streit, Seal Beach; Aaron Kenji Oki, Torrance, all of Calif.

[73] Assignee: TRW Inc., Redondo Beach, Calif.

[21] Appl. No.: 227,148

[22] Filed: Apr. 13, 1994

[51] Int. Cl.$^6$ .............................. H01L 29/73; H01L 29/70
[52] U.S. Cl. .................. 257/197; 257/198; 257/586; 257/592
[58] Field of Search ...................... 257/197, 198, 257/591, 592, 593, 586, 587, 588, 618, 622

[56] References Cited

U.S. PATENT DOCUMENTS

| | | | |
|---|---|---|---|
| 4,111,720 | 9/1978 | Michel et al. | 257/593 |
| 5,162,243 | 11/1992 | Shreit et al. | 257/198 |

OTHER PUBLICATIONS

Ghosh; "Pedestal Collector Transistor with Retarded Base"; Oct. 1971; IBM Technical Disclosure Bulletin vol. 14, No. 5 pp.1641–1642.

Ota, Y. et al., "Properties of MBE–Grown and O+ Implanted GaAs and Their Application to the Formation of a Buried Collector of an AlGaAs/GaAs HBT", J. Appl. Phys. 64(2), 15 Jul. 1988.

Asbeck, P. et al., IEEE Electron Devices Letter Ed1–5, 310 (1984).

Kim, M.E. et al, "GaAs/AlGaAs Heterojunction Bipolar Transistors and Integrated Circuits with High Current Gain for Device Geometries", GaAs IC Symposium Technical Digest, pp. 163–166 (1986).

*Primary Examiner*—Robert P. Limanek
*Assistant Examiner*—Wael M. Fahmy
*Attorney, Agent, or Firm*—Michael S. Yatsko

[57] ABSTRACT

This invention discloses a heterojunction bipolar transistor (HBT) which includes a relatively thin intrinsic collector region and a relatively thick extrinsic collector region such that collector-base capacitance is reduced and electron transit time is maintained. The fabrication of the HBT includes loading a semi-insulating substrate into an molecular beam epitaxy machine, and growing a sub-collector contact layer, a bottom collector layer and a top collector layer on the substrate. Next, the substrate is removed from the molecular beam epitaxy machine and the top collector layer is etched by a photolithographic process to produce separate intrinsic and extrinsic collector regions. Then, the substrate is again loaded into the molecular beam epitaxy machine so that the base and emitter layers can be grown. And finally, the emitter layer is etched to form an emitter mesa only over the intrinsic semiconductor region.

9 Claims, 3 Drawing Sheets

DOUBLE-EPITAXY HETEROJUNCTION BIPOLAR TRANSISTORS FOR HIGH SPEED PERFORMANCE

BACKGROUND OF THE INVENTION

1. Field of the Invention

This invention relates generally to a process for fabricating bipolar transistors and, more particularly, to a process for fabricating heterojunction bipolar transistors having relatively thin intrinsic collector regions and relatively thick extrinsic collector regions.

2. Discussion of the Related Art

Heterojunction bipolar transistors (HBTs) which incorporate a base and a collector of one semiconductor material, typically gallium arsenide (GaAs), and an emitter of a second semiconductor material, typically aluminum-gallium-arsenide (AlGaAs), are known in the art. HBT devices are popular because of a number of well known advantages over their homojunction bipolar transistor counterparts. These advantages include high speed, a high third order intermodulation product (IP3), a low noise/power ratio, and high current drive capabilities. These advantages provide a wide range of diverse functions of HBT devices for many commercial and industrial applications such as in communications and electronic warfare.

The performance of HBT devices critically depends on the thicknesses of the emitter, base, collector and sub-collector layers which form the transistor. In fabricating HBT devices, these thicknesses are generally accurately controlled by the semiconductor growth process of molecular beam epitaxy (MBE), well known to those skilled in the art. For high speed performances, the HBT devices are grown with very thin base and collector layers for providing short electron transit times through these layers. The area of the HBT device in which the base and collector must be very thin to provide desirable transit times is generally referred to as the intrinsic region, and is located directly below an emitter mesa making up the emitter. The area surrounding the intrinsic region, generally referred to as the extrinsic region, has no effect on electron transit time and therefore can be of any thickness. Since HBT devices are usually fabricated with one single MBE growth, the thickness of the extrinsic and intrinsic regions are generally the same.

An additional limiting factor for high speed performance of the HBT devices is the capacitance which is created at the base-collector interface due to the voltage drop across this junction. A typical base-collector voltage bias of an HBT device causes a separation of negative and positive charges to develop across the base-collector interface with the negative charges stored in the base layer and the positive charge stored in the sub-collector layers. Thus, the capacitance at this base-collector junction is, to a first approximation, equal to a parallel plate capacitor with the cathode and anode as the base and sub-collector, respectively. For high speed operations, this capacitance must be reasonably small. Therefore, the collector layer has to be correspondingly thick since the thickness of the collector layer is inversely proportional to the capacitance. The area of the HBT device where the collector layer must be thick to reduce capacitance is the extrinsic region.

As becomes clear from this discussion, the HBT device needs to satisfy both of the requirements of short electron transit times and low capacitance in order to realize a high speed device. Attempts have been made in the prior art to provide an HBT device having a thin collector layer for short electron transit times, but also having a reduced base-collector capacitance. One of those attempts deals with the implantation of impurities into the collector layer in order to damage the lattice structure outside of the active area of the transistor, and thus, reduce the base-collector capacitance. This process has the effect, however, of reducing the doping concentrations in the collector. See Ota, Y. et al., "Properties of MBE-Grown and 0+ Implanted GaAs And Their Application to the Formation of a Buried Collector of an AlGaAs/GaAs HBT", J. Appl. Phys. 64(2), 15 Jul. 1988. Additionally, attempts have been made at fabricating collector-up HBTs in which the base-collector junction area has a smaller area than the emitter-base junction. This configuration thus eliminates the extrinsic base-collector junction area. See Asbeck, P. et al., IEEE Electron Devices Letter Edl-5, 310 (1984).

Each of the attempts in the prior art to reduce base-collector capacitance while maintaining a thin collector layer, although somewhat successful, have led to one or more of the following drawbacks: a decrease in the semiconductor crystal quality which leads to a degradation in current gain, a reduction in reliability due to the diffusion of implanted impurities during high temperature and/or high voltage operation, and an increase in processing complexity. It is therefore an object of the present invention to provide a novel HBT structure which has both the base-collector capacitance and collector layer thickness minimized while avoiding the drawbacks mentioned above.

SUMMARY OF THE INVENTION

This invention discloses a process by which an HBT device is fabricated utilizing an MBE growth process in which an intrinsic collector region is made relatively thin and an extrinsic collector region is made relatively thick so as to increase the high speed operations of the HBT device. In a first step, a semi-insulating wafer substrate is loaded into an MBE machine in order to grow a first sub-collector layer on the semi-insulating substrate, a bottom-collector layer on the sub-collector layer, and a top-collector layer on the bottom-collector layer. If the bottom-collector layer and the top-collector layer have the same doping concentration, then they are included as a single collector layer. The wafer substrate, along with the three collector layers, is then unloaded from the MBE machine in order to fabricate a trench for an intrinsic collector region.

The trench fabricating process includes a photolithographic patterning process in which a photoresist material is deposited on the top-collector layer, and a mask for defining the intrinsic collector region is positioned relative to the photoresist layer. The mask and the wafer are then exposed to light of an appropriate wavelength such that the photoresist can be dissolved at the desirable locations for forming the trench. The top-collector layer is then etched where the photoresist was dissolved to form the intrinsic region. The collector area including the remaining top-collector layer is the extrinsic region. A cleaning process then follows in which the photoresist is stripped off the wafer.

The wafer substrate is then reloaded into the MBE machine for a second growth process which completes the HBT device structure. In this second growth procedure, the base is grown to a desirable thickness across both the intrinsic and extrinsic collector regions. Next, the emitter layers are grown on the base, and the wafer is then unloaded from the MBE machine. The emitter mesa is then formed by using a photolithographic and etching process similar to that discussed above. In this manner, the emitter mesa is positioned over the intrinsic region of the collector, and the surrounding extrinsic collector region has a greater thickness. Consequently, the collector is relatively thin in the intrinsic region allowing for short transit times and is relatively thick in the extrinsic region allowing for low capacitance. Therefore, an HBT device having high speed performances is developed.

Additional objects, advantages, and features of the present invention will become apparent from the following description and appended claims, taken in conjunction with the accompany drawings.

DETAILED DESCRIPTION OF THE PREFERRED EMBODIMENTS

The following description of the preferred embodiments concerning fabricating of an HBT device is merely exemplary in nature and is in no way intended to limit the invention or its application or uses.

Figure 1:
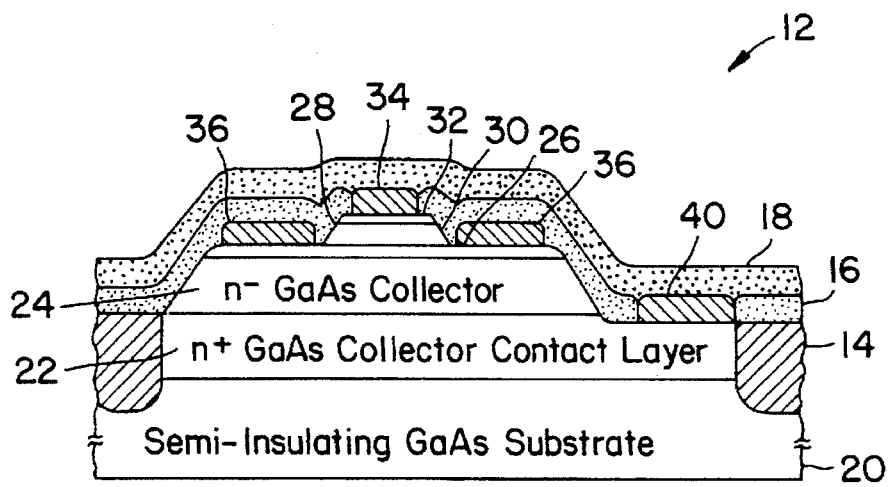
FIG. 1 is a cross sectional view of a prior art heterojunction bipolar transistor.

First turning to FIG. 1, a prior art HBT device 12 is shown. The HBT device 12 is shown in a cut-away format, but it will be understood that the device 12 includes a variety of different semiconductor devices (not shown) fabricated on a common semi-insulating substrate 20, such as GaAs, as is well known in the art. The HBT device 12 is separated from the other devices by a device isolation implant region 14. The isolation implant region 14 is generally a semiconductor material, such as GaAs, which has been implanted with impurity atoms, such as boron, oxygen, etc., in order to damage the semiconductor material, thus rendering it inoperative. Covering the HBT device 12, as well as the other devices, is a first dielectric layer 16 and a second dielectric layer 18 which are provided as passivation layers in order to protect the HBT device 12. Generally, each of the first dielectric layer 16 and the second dielectric layer 18 will be silicon nitride. This type of arrangement is very typical, and well known to those skilled in the art.

The HBT device 12 is formed of a number of layers grown on the substrate 20 by an MBE process, well known to those skilled in the art. Grown on top of the substrate 20 is a heavily doped n-type GaAs sub-collector contact layer 22. Grown on top of the sub-collector contact layer 22 is a lightly doped n-type GaAs collector layer 24. Both of the layers 22 and 24 make up the collector of the HBT device 12. Grown on top of the collector layer 24 is a thin, heavily doped p-type GaAs base layer 26. And finally, grown on top of the thin base layer 26 is an emitter layer 28 comprised of a doped n-type wide-gap AlGaAs emitter layer 30 in contact with the base layer 26, and a heavily doped n-type GaAs emitter contact layer 32. As is apparent, the collector layer 24 is of a consistent thickness across the extrinsic and intrinsic collector regions.

The emitter contact layer 32 acts as an ohmic contact region for providing a desirable electrical contact between the emitter layer 28 and an ohmic metal contact 34. Additionally, an ohmic metal contact 36 acts as the base contact to the HBT device 12. And an ohmic metal contact 40 acts as the collector contact to the HBT device 12. As can be seen, the ohmic contacts 34 and 40 are formed first by an etching process in which trench openings are formed into dielectric layer 16, and then by a deposition process in which metals are evaporated into the trench openings. Each of the collector layers 22 and 24, the base layer 26, and the emitter layer 28 are shaped by appropriate etching processes and implantation processes well known to those skilled in the art.

Figure 2:
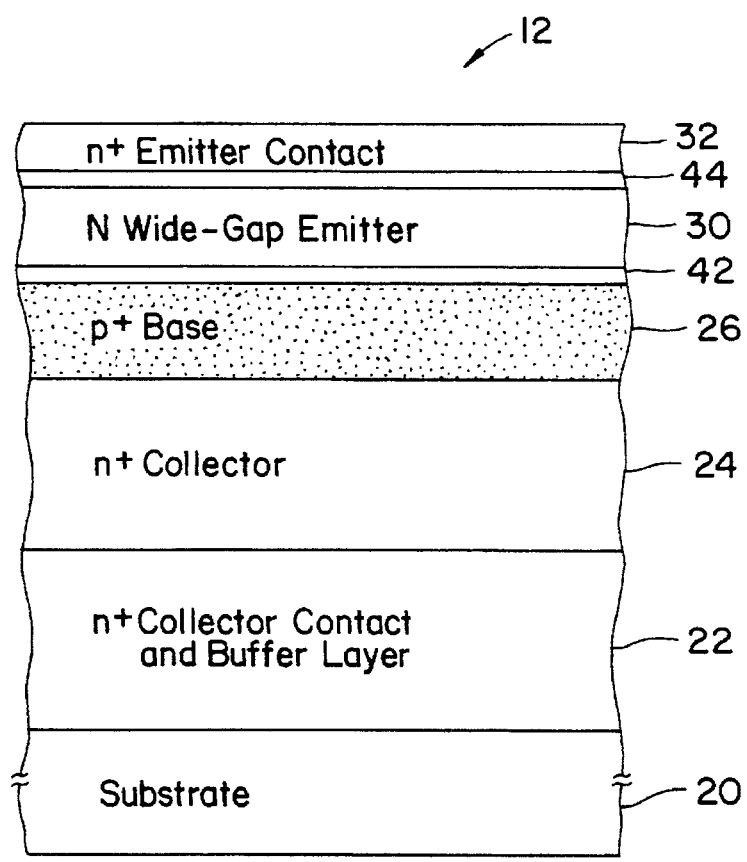
FIG. 2 is a cut-away cross sectional view of the prior art HBT of FIG. 1.

Turning to FIG. 2, a cut-away close-up illustration of the different layers of the HBT device 12 of FIG. 1 is shown in order to give a better description of the thicknesses and constituencies of each layer for many applications. The semi-insulating substrate 20 is approximately 2.5 mm thick. The sub-collector contact layer 22 is approximately 6000 angstroms thick and has a doping concentration of approximately $5 \times 10^{18}$ atoms/cm$^3$ of an appropriate n-type dopant, such as silicon. The collector layer 24 is approximately 7000 angstroms thick and has a doping concentration of approximately $7 \times 10^{15}$ atoms/cm$^3$ of an appropriate n-type dopant, also such as silicon. The base layer 26 is approximately 1400 angstroms thick and has a doping concentration of approximately $1 \times 10^{19}$ atoms/cm$^3$ of an appropriate p-type dopant, such as beryllium.

The emitter layer 28 includes a first graded layer 42 between the base layer 26 and the wide-gap emitter layer 30. The graded layer 42 provides a smooth transition for the electrons traveling from a GaAs region to an AlGaAs region. The graded layer 42 is approximately 300 angstroms thick and consists of graded Al$_x$Ga$_{1-x}$As, where the mole fraction of aluminum is zero adjacent the base layer 26 and is approximately 30% (x=0.3) adjacent the wide-gap emitter layer 30. The doping concentration of the first graded layer 42 is approximately $5 \times 10^{17}$ atoms/cm$^3$ of an appropriate n-type dopant, such as silicon. The wide-gap emitter layer 30 is approximately 1200 angstroms thick and has a doping concentration of approximately $5 \times 10^{17}$ atoms/cm$^3$ of an appropriate n-type dopant, such as silicon. Fabricated between the wide-gap emitter layer 30 and the emitter contact layer 32 is a second graded layer 44. The second graded layer 44 is also approximately 300 angstroms thick and consists of graded Al$_x$Ga$_{1-x}$As where the mole fraction of aluminum is zero adjacent the emitter contact layer 32 and is approximately 30% adjacent the wide-gap emitter layer 30. The doping concentration of the second graded layer 44 is also approximately $5 \times 10^{17}$ atoms/cm$^3$ of an appropriate n-type dopant, such as silicon. The emitter contact layer 32 is approximately 750 angstroms thick and has a doping concentration of approximately $7 \times 10^{18}$ atoms/cm$^3$ of an appropriate n-type dopant, such as silicon.

Figure 3A:
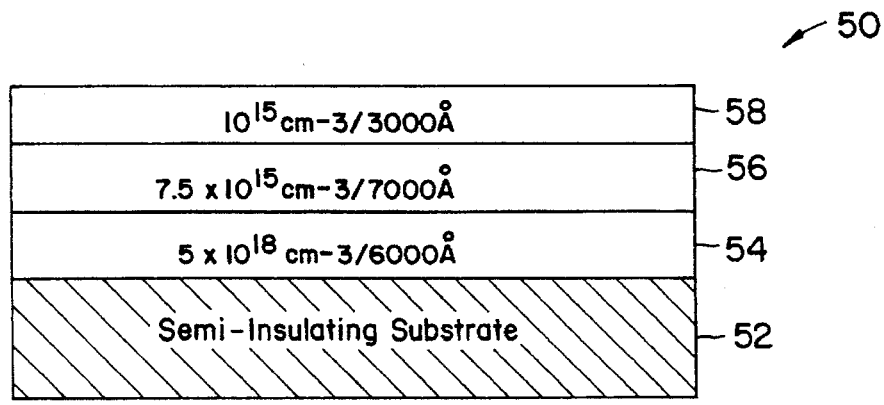
FIGS. 3(a)–3(d) illustrates a procedure for fabricating a heterojunction bipolar transistor according to one preferred embodiment of the invention.

Now turning to FIGS. 3(a)–3(d), a process for fabricating a double-epitaxy HBT (DEHBT) device according to a preferred embodiment of the present invention, is illustrated. FIG. 3(a) shows a semiconductor structure 50 including a semi-insulating substrate 52, generally GaAs, and three collector layers positioned on top of the substrate 52. In a preferred embodiment, each of the different collector layers of the structure 50 will be grown on the semi-insulating substrate 52 by an MBE process well known to those skilled in the art. Grown on top of the substrate 50 to a thickness of approximately 6000 angstroms is a heavily doped GaAs sub-collector contact layer 54 being doped with n-type impurity atoms to a concentration of approximately $5 \times 10^{18}$ atoms/cm$^3$. Grown on top of the sub-collector contact layer 54 to a thickness of approximately 7000 angstroms is a GaAs bottom-collector layer 56 being doped with n-type impurity atoms to a concentration of approximately $7.5 \times 10^{15}$ atoms/cm$^3$. Grown on top of the bottom-collector layer 56 to a thickness of approximately 3000 angstroms is a GaAs top-collector layer 58 being doped with n-type impurity atoms to a concentration of approximately $1 \times 10^{15}$ atoms/cm$^3$. It is possible to have an effective device in which both of the top and bottom collector layers 56 and 58 are of the same doping concentration. If this is the case, then obviously these layers will merge into one collector layer having a thickness of approximately 10000 angstroms.

Figure 3B:
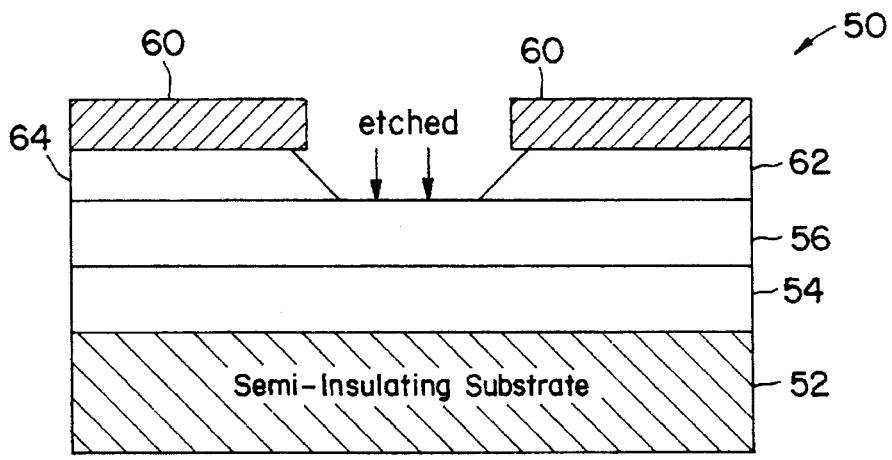

Once the structure 50 as shown in FIG. 3(a) is grown by the MBE process, the structure 50 is removed from the MBE machine to be photolithographically patterned. First, a photoresist layer 60 is deposited on the top-collector layer 58 by a process that is well known to those skilled in the art. Once the photoresist layer 60 is dried, a mask (not shown) is positioned in an appropriate location with respect to the structure 50. The structure 50 is then irradiated with appropriate radiation through the patterns in the mask, also by a process well known to those skilled in the art. The portion of the photoresist layer 60 which is irradiated through the patterned mask is then developed and etched away such that the top-collector layer 58 is exposed through the photoresist layer 60 with respect to the mask. Next, the top-collector layer 58 is etched at the exposed areas in order to form an intrinsic collector region to arrive at the structure 50 as depicted in FIG. 3(b). The top-collector layer 58 is etched down to a location proximate where the top surface of the bottom-collector layer 56 begins. Since the depth of etching is measured by the time of the etching rate, this depth may not be exact. However, a tolerance of ±500 angstroms will result in an equally effective device. If layers 56 and 58 are a single layer, then that layer is etched the appropriate distance to form the trench.

The remaining portions 62 and 64 of the top-collector layer 58 make up the extrinsic collector regions. An appropriate cleaning procedure is conducted to remove the remaining photoresist layer 60 from the wafer structure 50. This cleaning procedure, which is well known to those skilled in the art, generally consists of three different solutions to be applied sequentially. The three solutions are Acetone, Methanol, and a mixture of ammonium hydroxide, hydrogen peroxide, and water.

Figure 3C:
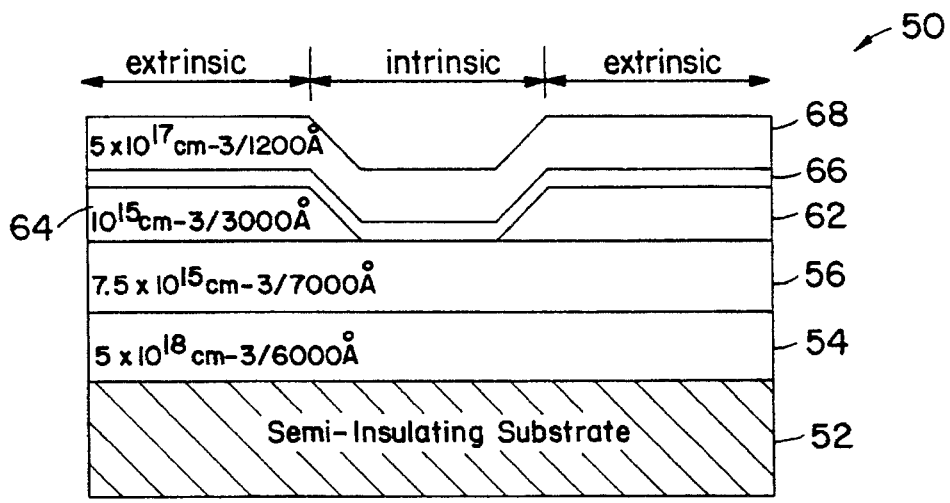

Once the photoresist layer 60 is completely removed, the wafer structure 50 is reloaded into the MBE machine for a second growth procedure which completes the HBT structure. Turning to FIG. 3(c), a base layer 66 is shown grown to a thickness of approximately 1400 angstroms over the two extrinsic collector portions 62 and 64 and the intrinsic region over the bottom-collector layer 56. The base layer 66 consists of a p-type GaAs layer being doped with p-type dopant atoms to a concentration of approximately $1 \times 10^{19}$ atoms/cm$^3$.

Next, an emitter layer 68 is grown over the base layer 66. The emitter layer 68 includes all of the graded layers, the wide-gap emitter layer and the emitter contact layer to the thicknesses, and the doping concentrations and constituencies, as discussed above with reference to FIGS. 1 and 2.

Figure 3D:
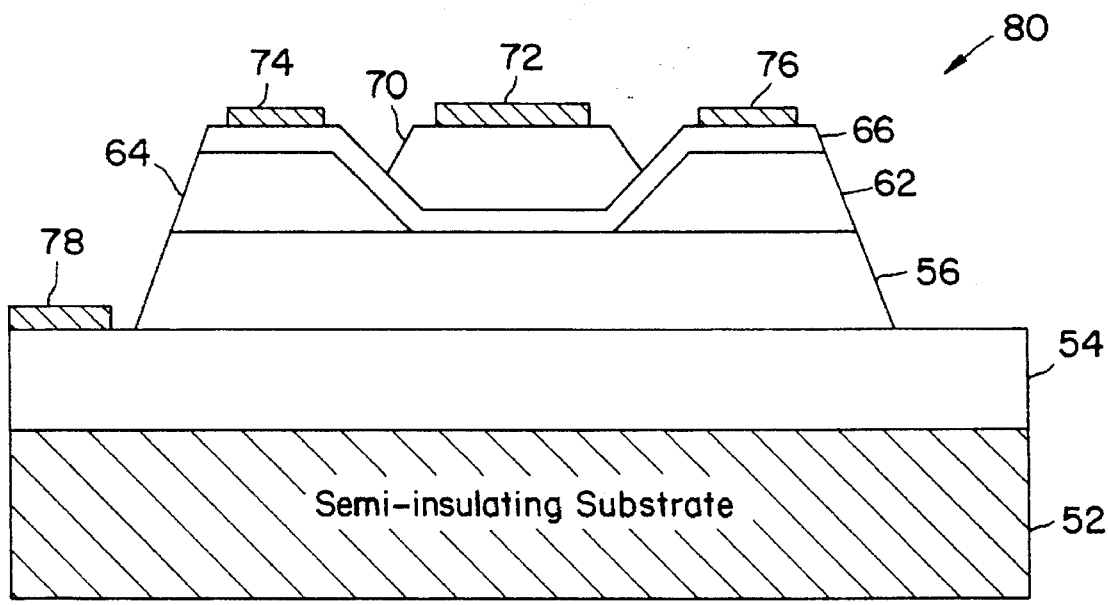

The fabrication process of the HBT structure 50 then follows the well known baseline process to form an HBT device 80 as depicted in FIG. 3(d). It is shown that the emitter layer 68 has been reduced to an emitter mesa 70 positioned directly above the intrinsic collector region. A second photolithographic pattern process similar to that as discussed above, provides the emitter mesa 70. Additionally, an ohmic emitter contact 72, ohmic base contacts 74 and an ohmic collector contact 78 are provided at their appropriate positions, also as discussed above. For a more in depth detailed procedure of these baseline steps, please refer to Kim, M. E., Camou, J. B., Oki, A. K., Stolt, K. S., and Mulvey, V. M., "GaAs/AlGaAs Heterojunction Bipolar Transistors and Integrated Circuits with High Current Gain for Device Geometries", GaAs IC Symposium Technical Digest, pp. 163–166 1986, herein incorporated by reference. It is noted, that the heterojunction bipolar transistor 80 includes a relatively thick collector region in the extrinsic area, thus providing low capacitance, and a relatively thin collector region in the intrinsic region, thus providing short electron transit times.

The HBT device 80 generated by the above described process has been described with specific reference to the layer thicknesses, doping concentrations, and semiconductor constituencies. However, these specific parameters are by way of one specific nonlimiting example. It will be understood, that other thicknesses, doping concentrations and semiconductor constituencies will be applicable for other applications without departing from the scope of the invention. Clearly, a range of doping concentrations will provide very effective devices as is well understood in the art. Moreover, other semiconductor heterojunction configurations, such as InGaAs/InAlAs/InP (indium gallium arsenide/indium aluminum arsenide/indium phosphide) are also applicable. And, other semiconductor growth processes may be applicable, such as chemical vapor deposition, to generate intrinsic and extrinsic collector regions having the configuration as discussed above.

Additionally, it is noted that the process of the above-described invention is also applicable to homojunction bipolar transistors for the same reasons as discussed above for the HBTs. There may be some application where a homojunction bipolar transistor is more applicable than a heterojunction bipolar transistor, but in which high speed of performance of the homojunction bipolar transistor may be crucial. Furthermore, the fabrication procedure discussed above is equally applicable to a PNP type heterojunction or homojunction bipolar transistor.

Figure 4:
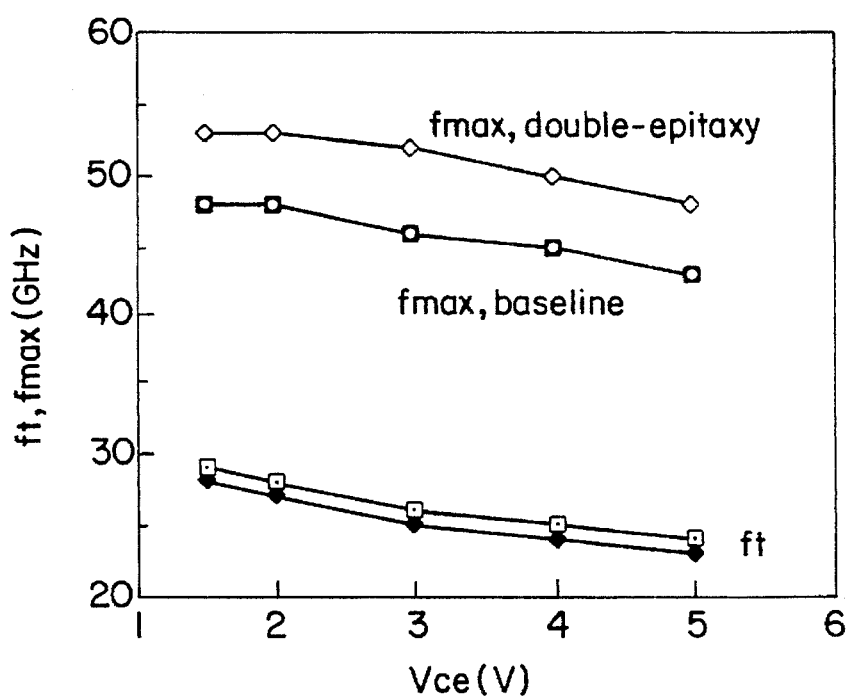
FIG. 4 is a graph of current gain and power gain cut-off frequencies versus collector-emitter voltage depicting the frequency responses of an HBT as fabricated by the process of FIGS. 3(a)–3(d).

Turning to FIG. 4, a graphic example of the improved results of an HBT device produced by the above process is shown. The graph shown in FIG. 4 includes collector-emitter voltage along the horizontal axis and frequency of operation of the HBT device along the vertical axis. The line including the diamond data points is for a device fabricated by the above process and the line including the square data points is for a prior art device. The measurements were made at a collector current density of 40kA/cm$^2$, Vce=1.5 to 5 V, on devices with an emitter area of approximately 10 micron square.

The current gain cut-off frequency ($f_t$), to a first order approximation, is determined mainly by the electron transit time in the HBT device. As seen in FIG. 4, the values of $f_t$ are substantially the same between the two devices because each of the devices has the same intrinsic region thickness and doping concentrations which dictate transit time. Since the maximum frequency of oscillation ($f_{max}$) is related to $f_t$ by the following equation:

$$f_{max} = \sqrt{\frac{f_t}{8\pi R_b C_{bc}}}$$

where $R_b$ is the base resistance and $C_{bc}$ is the base-collector capacitance (intrinsic and extrinsic), $f_{max}$ for the DEHBT device by virtue of a smaller extrinsic $C_{bc}$ should have a higher $f_{max}$. As can be seen in FIG. 4, a 5 GHz improvement in $f_{max}$ of the DEHBT device over the conventional HBT device is shown. This improvement is consistent over a wide range of Vce as shown, which makes the device useful for a wide range of application.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A bipolar transistor comprising:

a substrate;

a collector layer including at least a first collector layer and a second collector layer in contact with each other, said first collector layer forming an intrinsic collector region and the combination of said first collector layer and said second collector layer forming an extrinsic collector region, wherein the intrinsic collector region is defined by a removed portion of the second collector layer such that the extrinsic collector region has a greater thickness than the intrinsic collector region;

a base layer formed over the intrinsic collector region and the extrinsic collector region; and an emitter layer formed over the intrinsic collector region.

2. The bipolar transistor according to claim 1 wherein the semiconductor substrate is a semi-insulating substrate of gallium arsenide being approximately 2.5 mm thick.

3. The bipolar transistor according to claim 1 wherein the collector further comprises a sub-collector contact layer being positioned on the substrate below the first collector layer, said sub-collector contact layer being a gallium arsenide layer approximately 6000 angstroms thick, and further being doped with n-type impurity atoms to a doping concentration of approximately $5 \times 10^{18}$ atoms/cm$^3$.

4. The bipolar transistor according to claim 1 wherein the first collector layer is a gallium arsenide layer being approximately 7000 angstroms thick doped with n-type impurity atoms to a concentration of approximately $7.5 \times 10^{15}$ atoms/cm$^3$.

5. The bipolar transistor according to claim 1 wherein the second collector layer is a gallium arsenide layer being approximately 3000 angstroms thick doped with n-type impurity atoms to a concentration of approximately $1 \times 10^{15}$ atoms/cm$^3$.

6. The bipolar transistor according to claim 1 wherein the base layer is a gallium arsenide layer having a thickness of approximately 1400 angstroms doped with p-type impurity atoms to a concentration of approximately $1 \times 10^{19}$ atoms/cm$^3$.

7. The bipolar transistor according to claim 1 wherein the emitter layer is a series of emitter layers including a first graded layer formed on the base layer, a wide-gap emitter layer formed on the first graded layer, a second graded layer formed on the wide-gap emitter layer, and an emitter contact layer formed on the second graded layer, wherein the first graded layer is aluminum gallium arsenide including graded aluminum having substantially no aluminum adjacent the base layer and approximately 30% aluminum adjacent the wide-gap emitter layer and having a thickness of approximately 300 angstroms, the wide-gap emitter layer is aluminum gallium arsenide having a thickness of approximately 1200 angstroms, the second graded layer is aluminum gallium arsenide including graded aluminum having substantially no aluminum adjacent the emitter contact layer and approximately 30% aluminum adjacent the wide-gap emitter layer and having a thickness of approximately 300 angstroms, and the emitter contact layer is gallium arsenide having a thickness of approximately 750 angstroms.

8. The bipolar transistor according to claim 1 further comprising a collector ohmic contact in contact with the collector layer, at least one base ohmic contact in contact with the base layer and an emitter ohmic contact in contact with the emitter layer.

9. A bipolar transistor comprising:

a substrate;

a collector layer including at least a first collector layer and a second collector layer in contact with each other, said first collector layer forming an intrinsic collector region and the combination of said first collector layer and said second collector layer forming an extrinsic collector region, wherein the intrinsic collector region is defined by a removed portion of the second collector layer such that the extrinsic collector region has a greater thickness than the intrinsic collector region, and wherein a surface of the first collector layer in contact with the second collector layer is substantially planar across the intrinsic and extrinsic collector regions and a surface of the second collector layer opposite to the first collector layer is substantially planar adjacent the removed portion of the second collector layer;

a base layer formed over the intrinsic collector region and the extrinsic collector region; and an emitter layer formed over the intrinsic collector region.

* * * * *